United States Patent
Nakaiso et al.

(10) Patent No.: US 9,437,426 B2
(45) Date of Patent: Sep. 6, 2016

(54) METHOD OF MANUFACTURING SEMICONDUCTOR DEVICE

(71) Applicant: Hitachi Kokusai Electric Inc., Tokyo (JP)

(72) Inventors: Naoharu Nakaiso, Toyama (JP); Kazuhiro Yuasa, Toyama (JP); Yuki Kitahara, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 244 days.

(21) Appl. No.: 14/227,360

(22) Filed: Mar. 27, 2014

(65) Prior Publication Data

US 2014/0295648 A1  Oct. 2, 2014

(30) Foreign Application Priority Data

Mar. 28, 2013  (JP) ................. 2013-069109

(51) Int. Cl.
- C23C 16/24 (2006.01)
- H01L 21/02 (2006.01)
- H01L 21/3205 (2006.01)
- C23C 16/455 (2006.01)

(52) U.S. Cl.
CPC ......... *H01L 21/02532* (2013.01); *C23C 16/24* (2013.01); *C23C 16/45523* (2013.01); *H01L 21/0262* (2013.01); *H01L 21/02579* (2013.01); *H01L 21/32055* (2013.01)

(58) Field of Classification Search
CPC ............ C23C 16/24; C23C 16/45523; C23C 16/45525
See application file for complete search history.

(56) References Cited

U.S. PATENT DOCUMENTS

| | | | |
|---|---|---|---|
| 8,012,859 B1* | 9/2011 | Joe ................ | C23C 16/0227 438/478 |
| 2007/0065576 A1* | 3/2007 | Singh .............. | C23C 16/452 427/248.1 |
| 2007/0087581 A1* | 4/2007 | Singh .............. | C23C 16/22 438/780 |

(Continued)

FOREIGN PATENT DOCUMENTS

| | | |
|---|---|---|
| JP | 2010-251654 A | 11/2010 |
| JP | 2011-023576 A | 2/2011 |

(Continued)

OTHER PUBLICATIONS

Chiang, C.-M., et al., "A new CVD reaction for atomic layer deposition of silicon". Applied Surface Science 107 (1996) 189-196.*

(Continued)

*Primary Examiner* — Bret Chen
(74) *Attorney, Agent, or Firm* — Volpe and Koenig, P.C.

(57) ABSTRACT

A method of manufacturing a semiconductor device including: a process of transferring a substrate into a processing chamber; a first gas supplying process of supplying a B atom-containing gas into the processing chamber; a first purging process of purging an inside of the processing chamber under an atmosphere of the B atom-containing gas supplied in the first gas supplying process; a second gas supplying process of supplying an Si atom-containing gas into the processing chamber to form a non-doped Si film on the substrate, after the first purging process; and a second purging process of purging the inside of the processing chamber under an atmosphere of the Si atom-containing gas.

8 Claims, 11 Drawing Sheets

(56) References Cited

U.S. PATENT DOCUMENTS

| | | | | |
|---|---|---|---|---|
| 2008/0242107 | A1* | 10/2008 | Kono | C23C 16/345 |
| | | | | 438/762 |
| 2013/0075912 | A1* | 3/2013 | Wakatsuki | H01L 21/28556 |
| | | | | 257/753 |
| 2013/0344247 | A1* | 12/2013 | Ueyama | C23C 16/24 |
| | | | | 427/255.28 |
| 2015/0099374 | A1* | 4/2015 | Kakimoto | C23C 16/45534 |
| | | | | 438/791 |

FOREIGN PATENT DOCUMENTS

| | | | |
|---|---|---|---|
| JP | 2011-216784 | * | 10/2011 |
| JP | 2011-254063 A | | 12/2011 |
| JP | 2012-186275 | * | 9/2012 |
| JP | 2012-204691 A | | 10/2012 |

OTHER PUBLICATIONS

Saynatjoki, Antti, et al., "Atomic-layer-deposited thin films for silicon nanophotonics". SPIE, Newsroom, 10.1117/2.120104. 004218, pp. 1-3.*

* cited by examiner

FIG. 7A

| | TOP | CENTER | BOTTOM | BOTTOM100 | BOTTOM125 |
|---|---|---|---|---|---|
| AVERAGE FILM THICKNESS (Å) | 95.35 | 81.81 | 56.61 | | 43.75 |
| IN-PLANE FILM THICKNESS UNIFORMITY OF SUBSTRATE (±%) | 3 | 2.2 | 1.5 | | 2.2 |
| FILM THICKNESS UNIFORMITY BETWEEN SUBSTRATES (AVERAGE FILM THICKNESS ±%) | 69.38 ± 37.19 | | | | |

FIG. 7B

| | TOP | CENTER | BOTTOM100 | BOTTOM125 |
|---|---|---|---|---|
| AVERAGE FILM THICKNESS (Å) | 151.18 | 151.27 | 151.4 | 149.82 |
| IN-PLANE FILM THICKNESS UNIFORMITY OF SUBSTRATE (±%) | 0.6 | 0.7 | 0.9 | 1.1 |
| FILM THICKNESS UNIFORMITY BETWEEN SUBSTRATES (AVERAGE FILM THICKNESS ±%) | 150.92 ± 0.52% | | | |

METHOD OF MANUFACTURING SEMICONDUCTOR DEVICE

BACKGROUND

1. Technical Field

The present invention relates to a method of manufacturing a semiconductor device, a substrate processing method, and a substrate processing apparatus.

2. Related Art

Conventionally, when an Si film is formed by a CVD method, forming a non-doped Si film using $SiH_4$ (monosilane), $Si_2H_6$ (disilane) or the like as a reaction gas or forming a P-doped Si film by adding $PH_3$ (phosphine) or a B-doped Si film by adding $B_2H_6$ (diborane) or $BCl_3$ (boron trichloride) in $SiH_4$ or $Si_2H_6$ as a reaction gas, respectively, in order to diffuse B (boron) or P (phosphorus) as an impurity into a film, is performed.

When the Si film is formed at a low temperature of 400° C. or less, $Si_2H_6$ is generally used in order to form the non-doped Si film. When $Si_2H_6$ is used to form the non-doped Si film, a film thickness of the peripheral edge of a wafer (substrate) is rapidly increased and film thickness uniformity (in-plane film thickness uniformity) in the wafer is significantly poor. Furthermore, in terms of the film thickness in a batch, the film thickness of a bottom (boat bottom) is decreased and the film thickness uniformity between the wafers (inter-wafer film thickness uniformity) is also poor. For these problems, by adding B in $SiH_4$ and using a catalytic effect of B, it is possible to lower the temperature to the equivalent of that of the non-doped Si using $Si_2H_6$ and significantly improve the film thickness uniformity within the wafer. However, even when a film is formed by using this means, improvement in inter-wafer film thickness uniformity is insufficient. In particular, when using $SiH_4$ as the reaction gas, since it is necessary to add B therein, it is difficult to lower the B concentration in the film, and B may react with $SiH_4$, as a dopant, to become a B-doped Si film.

Since the wet etching rate of the B-doped Si film is significantly poor as compared with the non-doped Si film, there is a problem that raising the efficiency of the device manufacturing process becomes difficult. (For example, see JP 2012-204691 A)

SUMMARY

As described above, if $Si_2H_6$ is used in forming the non-doped Si film, the film thickness uniformity in the wafer is poor. If $SiH_4$ is used, it is necessary to additionally supply a boron-containing gas for processing at a low temperature, and thus, characteristics of the non-doped Si film may not be obtained depending on the concentration of boron-containing gas to be added.

It is an object of the present invention to provide a technique for forming a non-doped Si film with an excellent in-plane film thickness uniformity of the wafer and inter-wafer film thickness uniformity of wafers.

According to one aspect of the present invention, there is provided a method of manufacturing a semiconductor device, including: a process of transferring a substrate into a processing chamber; a first gas supplying process of supplying a boron-containing gas into the processing chamber; a first purging process of purging an inside of the processing chamber under an atmosphere of the boron-containing gas supplied in the first gas supplying process; a second gas supplying process of supplying a silicon-containing gas into the processing chamber to form a non-doped Si film on the substrate, after the first purging process; and a second purging process of purging the inside of the processing chamber under an atmosphere of the silicon-containing gas.

According to another aspect of the present invention, there is provided a substrate processing method, including: a process of transferring a substrate into a processing chamber; a first gas supplying process of supplying a boron-containing gas into the processing chamber; a first purging process of purging an inside of the processing chamber under an atmosphere of the boron-containing gas supplied in the first gas supplying process; a second gas supplying process of supplying a silicon-containing gas into the processing chamber to form a non-doped Si film on the substrate, after the first purging process; and a second purging process of purging the inside of the processing chamber under an atmosphere of the silicon-containing gas.

According to another aspect of the present invention, there is provided a substrate processing apparatus, including: a processing chamber configured to process a substrate; a boron-containing gas supply system installed in the processing chamber to supply a boron-containing gas; a silicon-containing gas supply system installed in the processing chamber to supply a silicon-containing gas; and a controller configured to control the boron-containing gas supply system and the silicon-containing gas supply system so as to control supplying amounts of the boron-containing gas and the silicon-containing gas, wherein the controller controls the boron-containing gas supply system and the silicon-containing gas supply system, when the substrate is transferred into the processing chamber, to supply the boron-containing gas from the boron-containing gas supply system by boron atoms, and after supplying the boron-containing gas, to supply the silicon-containing gas so as to form a non-doped Si film on the substrate.

According to the substrate processing apparatus of the present invention, it is possible to provide a technique by which a non-doped Si film with an excellent in-plane film thickness uniformity of the wafer and inter-wafer film thickness uniformity of the wafers is formed.

BRIEF DESCRIPTION OF DRAWINGS

FIG. 7A is a diagram showing a film thickness uniformity of an Si film of the related art, and FIG. 7B is a diagram showing a film thickness uniformity of an Si film according to the present invention;

DETAILED DESCRIPTION

A detailed description will hereinafter be given of an embodiment of the present invention with consultation of drawings.

The substrate processing apparatus according to the embodiment of the present invention includes a semiconductor manufacturing device that performs a processing process in a method of manufacturing a semiconductor device, as one example. In the following description, as the substrate processing apparatus, a case in which a batch type vertical semiconductor manufacturing device (hereinafter briefly referred to as a "processing apparatus") that performs oxidation, diffusion, CVD processing and the like on the substrate is applied will be described.

Figure 1:
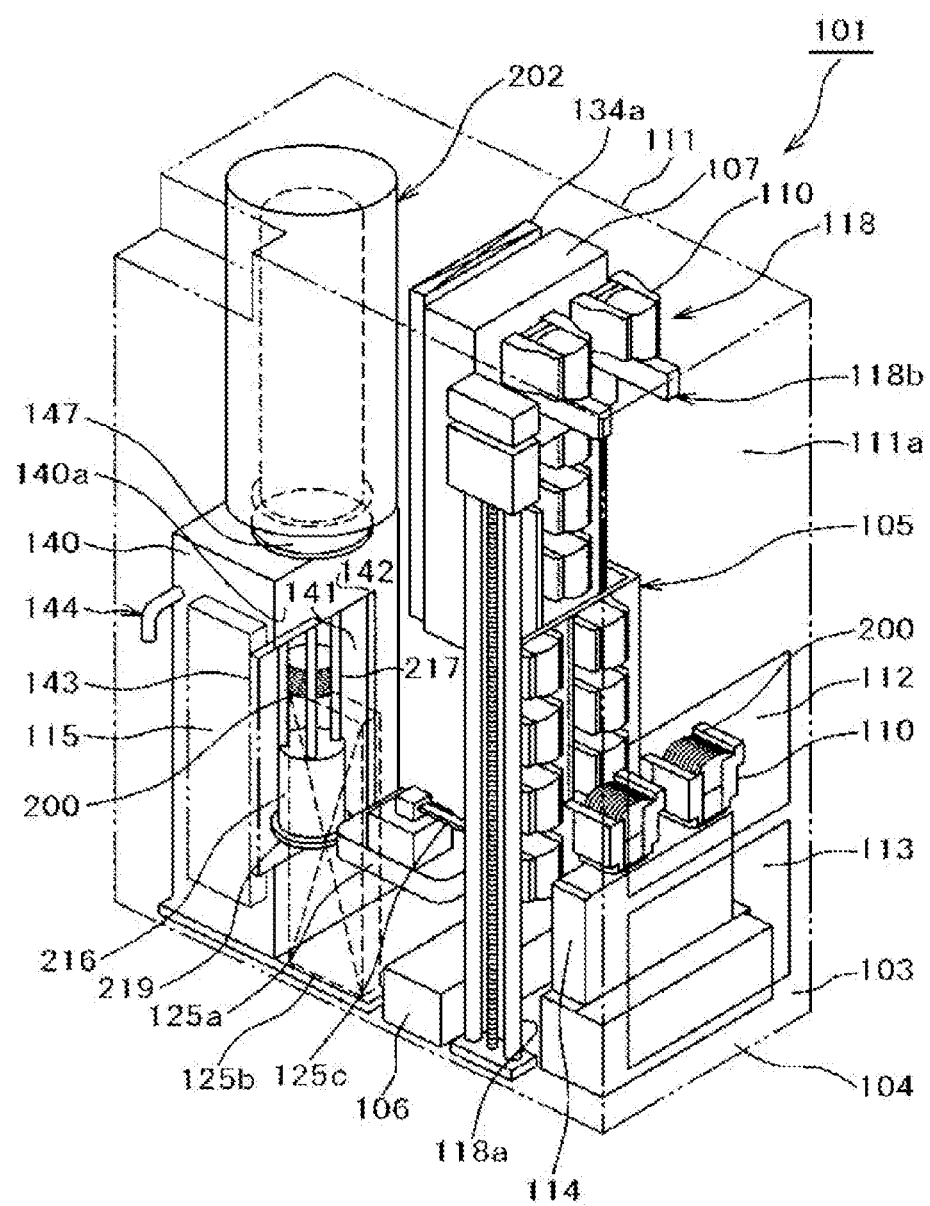
FIG. 1 is a perspective view showing a substrate processing apparatus according to an embodiment of the present invention.

As shown in FIG. 1, a processing apparatus 101, which uses a cassette (FOUP, also referred to as a pod) 110 as a wafer carrier in which a wafer 200 being a substrate made of a material such as a silicon is accommodated, includes a housing 111. The housing 111 includes a front maintenance opening 103 formed as an opening portion on a lower portion of a front wall 111a thereof so as to facilitate maintenance, and a front maintenance door 104 attached to open and close the front maintenance opening 103. The front maintenance door 104 is provided with a cassette loading/unloading entrance (substrate accommodating unit loading/unloading entrance) 112 formed in the front maintenance door 104 so as to communicate an inside and outside of the housing 111. The cassette loading/unloading entrance 112 is configured to be opened and closed by a front shutter (opening/closing mechanism for the substrate accommodating unit loading/unloading entrance) 113. Furthermore, the housing 111 includes a cassette stage (substrate accommodating unit delivery table) 114 installed inside of the cassette loading/unloading entrance 112. The cassette 110 is loaded on the cassette stage 114, and unloaded from the cassette stage 114 by an in-process transfer device (not shown). The cassette stage 114 is configured in such a way that the wafer 200 in the cassette 110 is vertically positioned by the in-process transfer device and a wafer take in/out entrance of the cassette 110 is directed upward.

The housing 111 is provided with a cassette shelf (substrate accommodating unit mounting shelf) 105 installed in a substantially center bottom thereof in a longitudinal direction of the housing 111. The cassette shelf 105 stores a plurality of cassettes 110 in a plurality of stages and a plurality of columns and is installed so as to facilitate the wafer 200 being taken in and out of the cassette 110. The cassette shelf 105 is installed to move laterally on a slide stage (horizontal movement mechanism) 106. In addition, a buffer shelf (substrate accommodating unit storage shelf) 107 is installed above the cassette shelf 105, which is configured to store the cassette 110.

A cassette transfer device (substrate accommodating unit transfer device) 118 is installed between the cassette stage 114 and the cassette shelf 105. The cassette transfer device 118 includes a cassette elevator (substrate accommodating unit lifting mechanism) 118a capable of being elevated while holding the cassette 110, and a cassette transfer mechanism (substrate accommodating unit transfer mechanism) 118b as a transfer mechanism. The cassette elevator 118a and the cassette transfer mechanism 118b are configured so as to facilitate transfer of the cassette 110 between the cassette stage 114, the cassette shelf 105, and the buffer shelf 107 by a continuous operation thereof.

A wafer transfer mechanism (substrate transfer mechanism) 125 is installed at a rear of the cassette shelf 105. The wafer transfer mechanism 125 includes a wafer transfer device (substrate transfer mechanism) 125a capable of rotating and linearly moving the wafer 200 in a horizontal direction, and a wafer transfer device elevator (substrate transfer device elevator mechanism) 125b for elevating the wafer transfer device 125a. As schematically shown in FIG. 1, the wafer transfer device elevator 125b is installed at a left end portion of the housing 111. These wafer transfer device elevator 125b and wafer transfer device 125a are configured to charge and discharge the wafer 200 to and from a boat 217 by a continuous operation thereof in such a way that a tweezers (substrate holding body) 125c of the wafer transfer device 125a servers as a placing part for the wafer 200.

As shown in FIG. 1, the buffer shelf 107 is provided with a clean unit 134a installed on a rear thereof so as to supply clean air of a purified atmosphere. The clean unit 134a includes a supply fan and a dust proof filter and is configured to flow the clean air within the housing 111. Further, another clean unit (not shown) including a supply fan and a dust proof filter is installed at a right end portion of a side opposite to the wafer transfer device elevator 125b side. The clean air blown out of the clean unit is configured to be sucked into an exhaust device (not shown) after flowing through the wafer transfer device 125a, and then exhausted to the outside of the housing 111.

A housing 140 (hereinafter referred to as pressure-resistant housing) is installed at a rear side of the wafer transfer device (the substrate transfer device) 125a and has an air-tightness performance capable of maintaining a pressure of less than atmospheric pressure (hereinafter referred to as subatmospheric pressure). The pressure-resistant housing 140 forms a load lock chamber 141, which is a load lock type standby chamber having a volume capable of accommodating the boat 217.

The pressure-resistant housing 140 is provided with a wafer loading/unloading entrance (substrate loading/unloading entrance) 142 formed in a front wall 140a thereof. The wafer loading/unloading entrance 142 is configured so as to be opened and closed by a gate valve (opening/closing mechanism for a substrate loading/unloading entrance) 143. A gas supply pipe 144 for supplying an inert gas such as nitrogen gas into the load lock chamber 141 and an exhaust pipe (not shown) for evacuating the load lock chamber 141 to a subatmospheric pressure are connected to a pair of side walls of the pressure-resistant housing 140.

A processing furnace 202 is installed above the load lock chamber 141. The processing furnace 202 is configured such that a lower end portion thereof is opened and closed by a furnace port gate valve (furnace port opening/closing mechanism) 147.

As schematically shown in FIG. 1, the load lock chamber 141 includes a boat elevator 115 installed therein for elevating a boat 217. A seal cap 219 as a lid body is mounted horizontally on an arm (not shown) which is connected to the boat elevator 115 as a connector. The seal cap 219 is configured so as to vertically support the boat 217, and close the lower end portion of the processing furnace 202.

The boat 217 includes a plurality of holding members and is configured to horizontally hold a plurality (for example, about 50 to 150 sheets) of wafers 200 in a state of being stacked in a vertical direction by aligning the center thereof, respectively.

Next, an operation of the processing apparatus according to the embodiment of the present invention will be described.

As shown in FIG. 1, prior to the cassette 110 being supplied to the cassette stage 114, the cassette loading/unloading entrance 112 is opened by the front shutter 113. Thereafter, the cassette 110 is loaded from the cassette loading/unloading entrance 112 and placed on the cassette stage 114 in such a way that the wafer 200 in the cassette 110 is vertically positioned and the wafer take in/out entrance of the cassette 110 is directed upward.

Then, the cassette 110 is picked up from the cassette stage 114 by the cassette transfer device 118 and the wafer 200 in the cassette 110 is in a horizontal position, and then the cassette 110 is rotated by 90° in the vertical direction toward the rear of the housing in such a way that the wafer take in/out entrance of the cassette 110 is directed toward the rear of the housing. Subsequently, the cassette 110 is automatically transferred on a designated shelf position of the cassette shelf 105 or the buffer shelf 107 by the cassette transfer device 118 and stored temporarily therein, or conveyed directly to a wafer take-out position of the cassette shelf 105.

The cassette shelf 105 is horizontally moved by the slide stage 106 so that the cassette 110 to be transferred is positioned to face the wafer transfer device 125a.

If the wafer loading/unloading entrance 142 of the load lock chamber 141, whose inside has been in an atmospheric pressure state in advance, is opened by the operation of the gate valve 143, the wafer 200 is picked up by tweezers 125c of the wafer transfer device 125a from the cassette 110 through the wafer take in/out entrance thereof. Then, the wafer 200 is placed in the boat 217 by the wafer transfer device 125a. The wafer transfer device 125a is returned to the cassette 110 to load the next wafer 200 in the boat 217.

If a predetermined number of wafers 200 are loaded into the boat 217, the wafer loading/unloading entrance 142 is closed by the gate valve 143 and the pressure of the load lock chamber 141 is reduced by being vacuum-exhausted from the exhaust pipe. When the pressure in the load lock chamber 141 is reduced to the same level of the pressure in the processing furnace 202, the lower end portion of the processing furnace 202 is opened by the furnace port gate valve 147. Subsequently, the seal cap 219 is ascended by the boat elevator 115, and then the boat 217 supported by the seal cap 219 is loaded into the processing furnace 202.

After loading, a process to be described below is performed on the wafer 200 in the processing furnace 202. After processing, the boat 217 is drawn out by the boat elevator 115, and further, the pressure in the load lock chamber 141 is restored to an atmospheric pressure, then the gate valve 143 is opened. Then, the wafer 200 and the cassette 110 are delivered to the outside of the housing 111 in substantially the reverse procedure of the above-described sequence.

Figure 2:
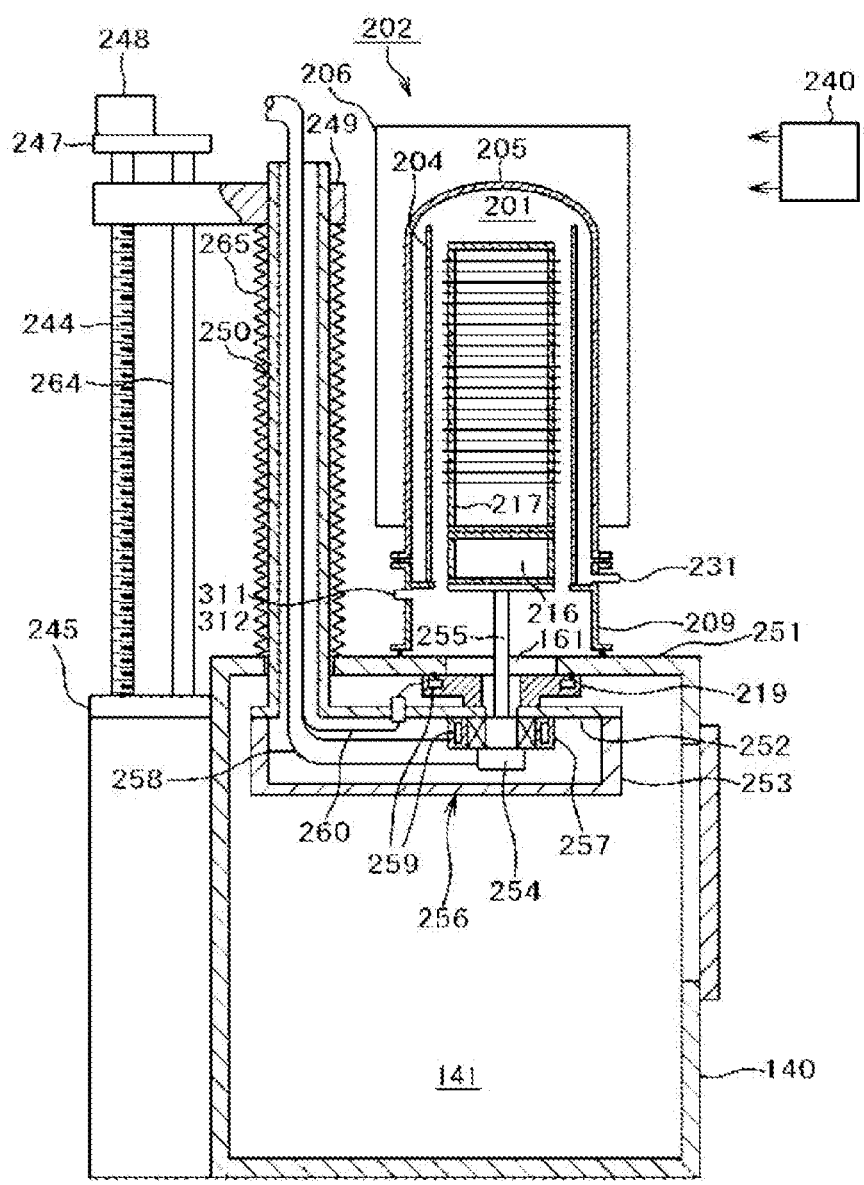
FIG. 2 is a vertical sectional view of the substrate processing apparatus according to the embodiment of the present invention.

Next, a schematic configuration around the processing furnace of the substrate processing apparatus according to the embodiment of the present invention will be described. FIG. 2 is a vertical sectional view showing the schematic configuration of the processing furnace 202 of the substrate processing apparatus and around thereof used in the embodiment of the present invention.

In FIG. 2, a lower substrate 245 is installed on an outer surface of the load lock chamber 141 as the standby chamber. The lower substrate 245 is provided with a guide shaft 264 fitted with an elevating stand 249 and a ball screw 244 screwed with the elevating stand 249. An upper substrate 247 is installed on upper ends of the guide shaft 264 and the ball screw 244 which are erected from the lower substrate 245. The ball screw 244 is rotated by an elevating motor 248 which is installed on the upper substrate 247. The elevating stand 249 is elevated by rotating the ball screw 244.

A hollow elevating shaft 250 is vertically installed in the elevating stand 249, and a connecting portion between the elevating stand 249 and the elevating shaft 250 is airtightly sealed. The elevating shaft 250 is configured so as to be elevated along with the elevating stand 249. The elevating shaft 250 is loosely inserted in a top plate 251 of the load lock chamber 141. A through hole of the top plate 251, through which the elevating shaft 250 is passed, has a sufficient margin so as not to contact with the elevating shaft 250. A bellows 265, as a hollow extendable body having elasticity so as to cover the periphery of the elevating shaft 250, is installed between the pressure-resistant housing 140 and the elevating stand 249 for airtightly maintaining the load lock chamber 141. The bellows 265 is configured to have an amount of expansion and contraction sufficiently coping with the amount of lifting and lowering of the elevating stand 249, and have an inner diameter sufficiently large compared with an outer shape of the elevating shaft 250 so as not to contact therewith by expansion and contraction of the bellows 265.

An elevating substrate 252 is horizontally fixed to the lower end of the elevating shaft 250. A drive unit cover 253 is airtightly mounted on a lower surface of the elevating substrate 252 through a sealing member such as an O-ring. The elevating substrate 252 and the drive unit cover 253 form a drive unit storage case 256. With this configuration, the inside of the drive unit storage case 256 is isolated from the atmosphere in the load lock chamber 141.

In addition, the drive unit storage case 256 is provided with a rotation mechanism 254 for rotating the boat 217 installed therein, and a cooling mechanism 257 surrounding the periphery of the rotation mechanism 254 for cooling the same.

A power supply cable 258 is connected to the rotation mechanism 254 leading from the upper end of the elevating shaft 250 thereto through a hollow section of the elevating shaft 250. In addition, cooling passages 259 are formed in the cooling mechanism 257 and the seal cap 219, and a cooling water pipe 260 for supplying cooling water is connected to the cooling passages 259 passing through the hollow section of the elevating shaft 250 from the upper end of the elevating shaft 250.

When the ball screw 244 is rotated by driving the elevating motor 248, the drive unit storage case 256 is elevated through the elevating stand 249 and the elevating shaft 250.

If the drive unit storage case 256 is ascended, a furnace port 161, which is an opening of the processing furnace 202, is closed by the seal cap 219 airtightly mounted on the elevating substrate 252, and thereby it is possible to perform the wafer processing. When the drive unit storage case 256 is descended, the boat 217 is descended along with the seal cap 219, and thereby it is possible to unload the wafer 200 to outside.

Figure 3:
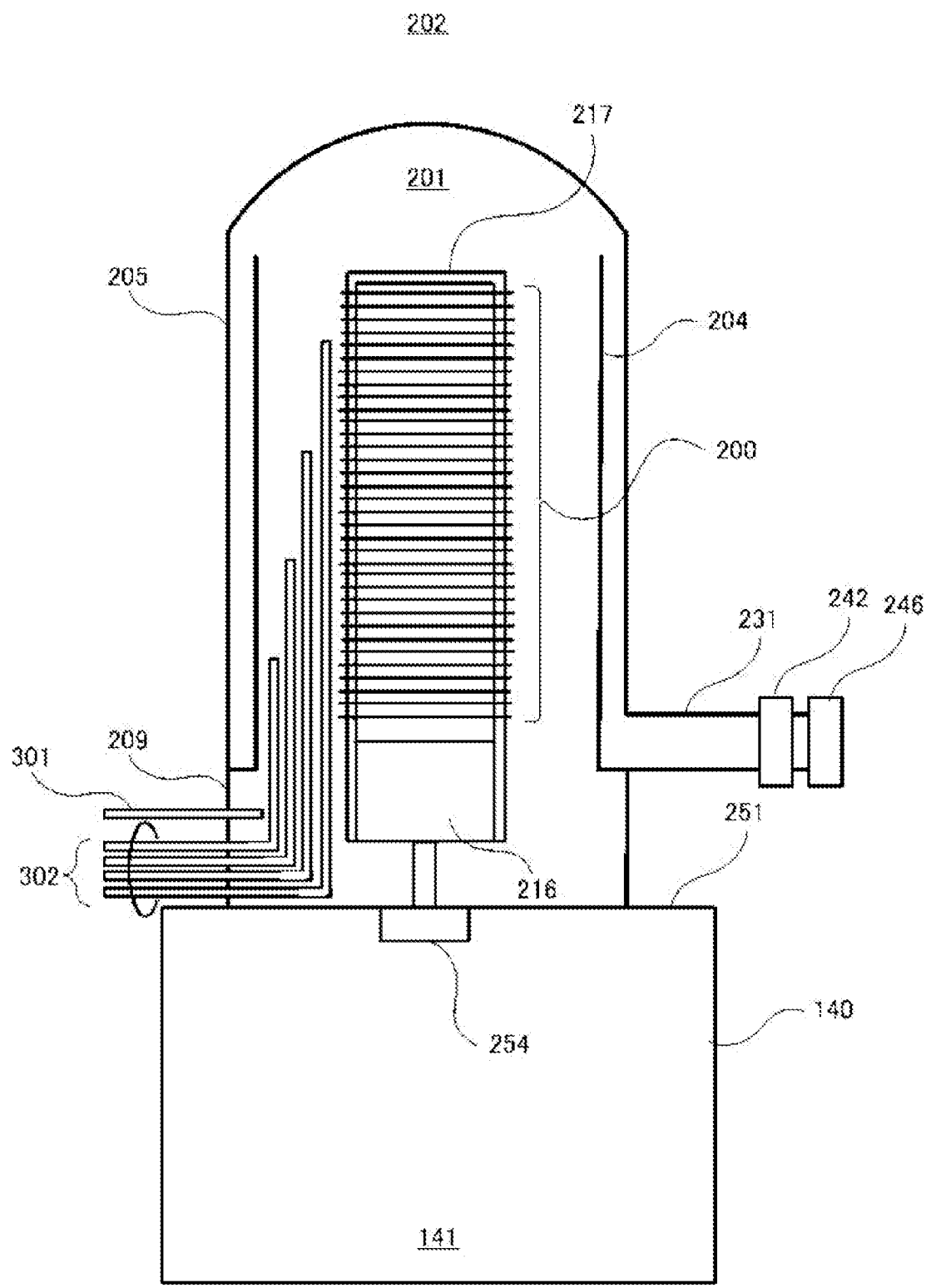
FIG. 3 is a vertical sectional view of a processing furnace of the substrate processing apparatus according to the embodiment of the present invention.

Next, the processing furnace of the substrate processing apparatus according to the embodiment of the present invention will be described with reference to FIGS. 2 and 3. FIG. 3 is a vertical sectional view showing a schematic configuration of the processing furnace 202 of the substrate processing apparatus used in the embodiment of the present invention. As shown in FIG. 2, the processing furnace 202 includes an outer tube 205, an inner tube 204, gas supply pipes 311 and 312, a gas exhaust pipe 231, the boat 217 and the like. The outer tube 205, a manifold 209, and the like form a processing chamber 201.

The outer tube 205 is made of quartz ($SiO_2$) material, as a heat-resistant material, and formed in a cylindrical outer shape with a closed upper end and an open lower end. The inner tube 204 is disposed inside of the outer tube 205. The inner tube 204 is also made of quartz ($SiO_2$) material, as a heat-resistant material, and formed in a cylindrical outer shape with open upper and lower ends. The processing chamber 201 is formed inside of the inner tube 204. The boat 217, on which a plurality of wafers 200 as substrates are mounted in a state of being stacked in a vertical direction by aligning in a multi-stage in a horizontal configuration, is accommodated in the processing chamber 201.

The manifold 209 is disposed concentrically with the outer tube 205 under the outer tube 205. The manifold 209 is made of a material such as quartz ($SiO_2$), stainless steel, or the like, and formed in a cylindrical shape with open upper and lower ends. The manifold 209 is provided to support the outer tube 205 and the inner tube 204. Moreover, an O-ring, as a sealing member, is disposed between the manifold 209 and the outer tube 205. The manifold 209 is supported on the top plate 251 of the pressure-resistant housing 140 via the O-ring, and thereby the outer tube 205 is in a state of being installed vertically.

Referencing to FIG. 3, a horizontally-disposed gas supply nozzle 301, gas supply nozzles 302 which are installed in a multi-stage format so as to rise along an inner wall of the inner tube 204 from bottom to top toward a stacking direction of the wafer, and a gas exhaust pipe 231 are installed on an outer wall of the manifold 209. In this embodiment, although one gas supply nozzle 301 and four gas supply nozzles 302 are provided, a single or a plurality of gas supply nozzles 301 and 302 may be provided.

The gas supply nozzles 301 and 302 are provided so as to communicate with an inner space of the inner tube 204. The gas exhaust pipe 231 is provided so as to communicate with the space between the outer tube 205 and the inner tube 204. Therefore, the gases supplied from the gas supply nozzles 301 and 302 are configured to enter the inner space of the inner tube 204, rise in the inner tube 204 passing through the stacked wafers, turn down from the upper end opening of the inner tube 204, lower through a space between the outer tube 205 and the inner tube 204, and flow out to the gas exhaust pipe 231.

The gas supply nozzles 301 and 302 have gas supply holes formed on downstream ends thereof in the embodiment of the present invention. Alternatively, the gas supply nozzles 301 and 302 may be a multi-hole nozzle in which a plurality of gas supply holes are formed on a side wall thereof.

A disilane gas ($Si_2H_6$) supply source containing silicon gas, a nitrogen gas ($N_2$) supply source containing nitrogen gas, which is an inert gas, a mass flow controller (MFC) as a gas flow control device, and an on-off valve are connected to the upstream of the gas supply nozzle 301. By controlling the MFC and/or the on-off valve, the disilane gas, the nitrogen gas, or a mixture of the disilane gas and nitrogen gas is supplied into the processing chamber 201 from the gas supply nozzle 301.

A boron trichloride gas ($BCl_3$) supply source containing boron as an impurity containing gas, a nitrogen gas ($N_2$) supply source containing nitrogen gas, which is an inert gas, a mass flow controller (MFC) as a gas flow control device, and an on-off valve are connected to the upstream of the gas supply nozzles 302, respectively. By controlling the MFC and/or the on-off valve, the boron trichloride gas, the nitrogen gas, or a mixture of the boron trichloride gas and nitrogen gas is supplied into the processing chamber 201 from the gas supply nozzles 302.

Moreover, each of these B (boron)-containing gas supply source, inert gas supply source, MFC, and on-off valve may be provided for each gas supply nozzle, or each one thereof may be provided for all of the gas supply nozzles and be supplied by a branching means.

In addition, the gas supply source may be capable of controlling the flow rate of each nozzle by providing each one of the gas supply sources and providing the MFC and the on-off valve for each nozzle after branching.

Moreover, a controller 240 (shown in FIG. 2) is electrically connected to each MFC and each valve so as to control a flow rate of the supplying gas to be a desired flow rate at a desired timing.

A vacuum exhaust device 246 such as a vacuum pump, or the like is connected to the downstream of the gas exhaust pipe 231 through a pressure sensor (not shown), as a pressure detector, and an APC valve 242, as a pressure regulator. An exhaust system, that is, a gas exhaust unit mainly includes the gas exhaust pipe 231 and the APC valve 242. Moreover, the vacuum exhaust device 246, such as a vacuum pump, or the like, may be included in the gas exhaust unit.

The controller 240 is electrically connected to the pressure sensor and the APC valve 242. The controller 240 is configured to adjust a degree of opening of the APC valve 242 such that a pressure within the processing chamber 201 becomes a desired pressure at a desired timing based on the pressure detected by the pressure sensor.

As a furnace port lid body, a seal cap is installed on the lower end portion of the manifold 209 for airtightly closing the lower end opening of the manifold 209. The seal cap is made of metal such as stainless steel or the like and formed in a disk shape. An O-ring is installed on the seal cap, as a sealing member, contacting the lower end of the top plate 251.

The rotation mechanism 254 is installed in the seal cap. A rotating shaft of the rotation mechanism 254 passes through the seal cap to be connected to the boat 217, and is configured to rotate the wafer 200 by rotating the boat 217.

The seal cap is configured to be elevated in the vertical direction by the elevating motor 248 serving as the elevating mechanism installed outside of the processing furnace 202. Therefore, it is possible to load and unload the boat 217 into the processing chamber 201.

The controller 240 is electrically connected to the rotation mechanism 254 and the elevating motor 248, and configured to control these parts so as to perform a desired operation at a desired timing.

(Controller)

As described above, a controller 240 as a controller is electrically connected to the rotation mechanism 254, the boat elevator 115, a heater 206, a temperature sensor, the pressure sensor, the APC valve 242 as the pressure control device, the exhaust device 246, the mass flow controller, and valves, respectively, to control the operations of the components of the substrate processing apparatus.

Specifically, the controller 240 is configured to control the rotation mechanism 254 such that the rotating shaft 255 thereof is rotated at a desired timing. The controller 240 is configured to control the boat elevator 115 so as be elevated at a desired timing. In addition, the controller 240 is configured to control the degree of opening of the APC valve 242 based on pressure information detected by the pressure sensor such that the pressure within the processing chamber 201 becomes a desired pressure at a desired timing. In addition, the controller 240 is configured to control an electrical connection to the heater 206 based on temperature information detected by the temperature sensor such that the temperature within the processing chamber 201 and the surface of the wafer 200 becomes a desired temperature at a desired timing. Further, the controller 240 controls the flow rate of the respective mass flow controller while also controlling the opening and closing of the respective valves, such that the supply of gas into the processing chamber 201 with a predetermined flow rate may be started or stopped at a desired timing.

In the embodiment of the present invention, the semiconductor device manufacturing method is configured in such a way that a process of depositing B on the wafer 200 by supplying the $BCl_3$ gas, as a small amount of B-containing gas, into the processing chamber 201 in which the wafer 200 is accommodated, and a process of growing Si film on the surface of the substrate by supplying $Si_2H_6$ gas, as a Si-containing gas, to react with the deposited B on the wafer 200 are set as one cycle, and this cycle is performed at least one or more times.

In the processing furnace 202 having the above configuration, $Si_2H_6$, which is a Si-containing gas, is supplied from the Si-containing gas supply source, subjected to adjustment of the flow rate thereof by the MFC, and then introduced into the processing chamber 201 from the gas supply nozzle 301 through the valve. At the same time, as a carrier gas, nitrogen gas, which is an inert gas, is supplied from the nitrogen gas supply source, subjected to adjustment of the flow rate thereof by the MFC, and then introduced into the processing chamber 201 form the gas supply nozzle 301 through the valve.

$BCl_3$, which is a B-containing gas, is supplied from the B-containing gas supply source, subjected to adjustment of the flow rate thereof by the MFC, and then introduced into the processing chamber 201 from the gas supply nozzles 302 through the valves. At the same time, as a carrier gas, nitrogen gas, which is an inert gas, is supplied from the nitrogen gas supply source, subjected to adjustment of the flow rate thereof by the MFC, and then introduced into the processing chamber 201 from the gas supply nozzles 302 through the valves.

The gas in the processing chamber 201 is directed to the vacuum pump 246 through the gas exhaust pipe 231 to be exhausted therefrom.

As shown in FIG. 3, as a heat insulation member, a heat insulation cylinder 216, which is made of quartz ($SiO_2$) as a heat-resistant material and has a cylindrical shape, is disposed under the boat 217, and is configured so that heat from the heater 206 is not easily transmitted to the manifold 209 side. In addition, the heat insulation cylinder 216 may be integrally formed with the boat 217 without being provided with the boat 217 as a separate body, and a plurality of heat insulation plates may be installed under the boat 217, instead of the heat insulation cylinder 216.

Figure 4:
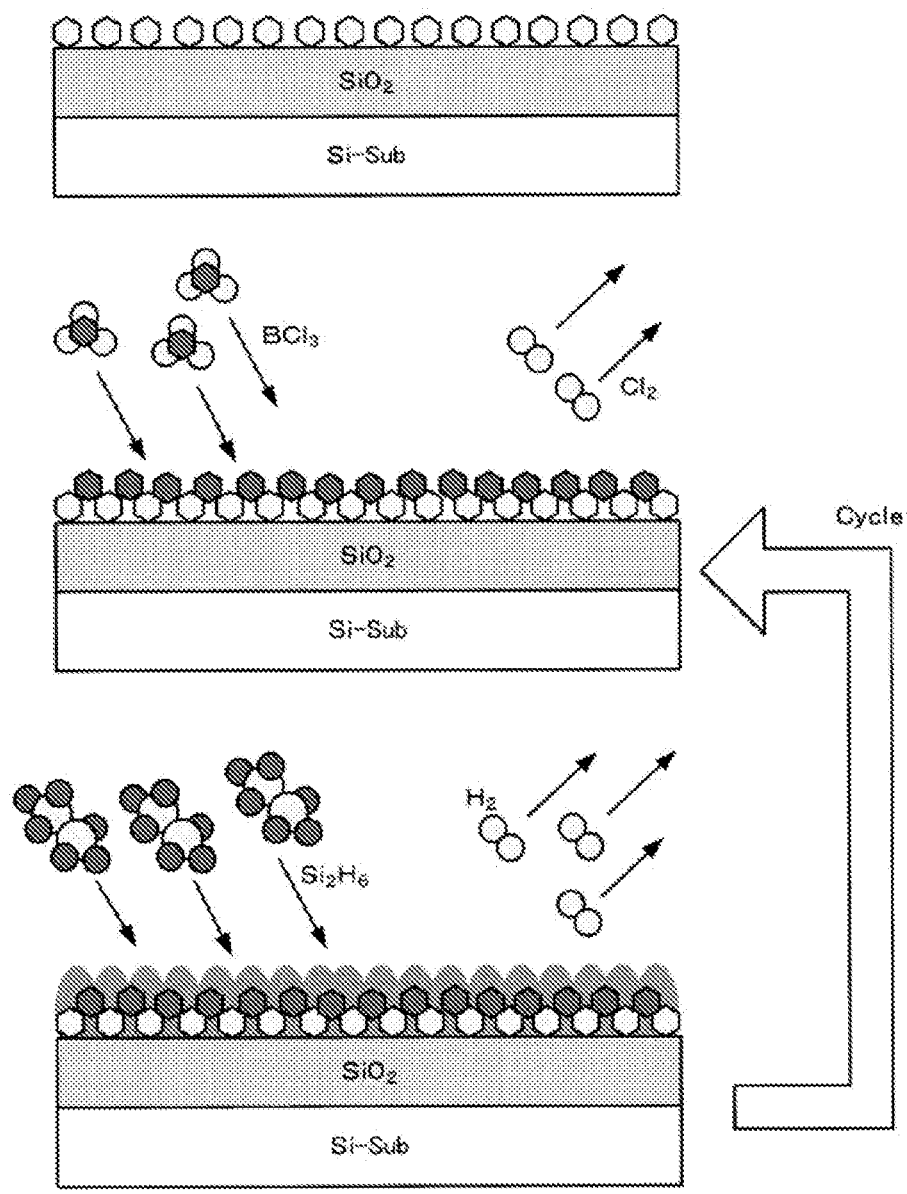
FIG. 4 is a flow diagram showing a film forming procedure in a substrate processing process according to the embodiment of the present invention.
Figure 5:
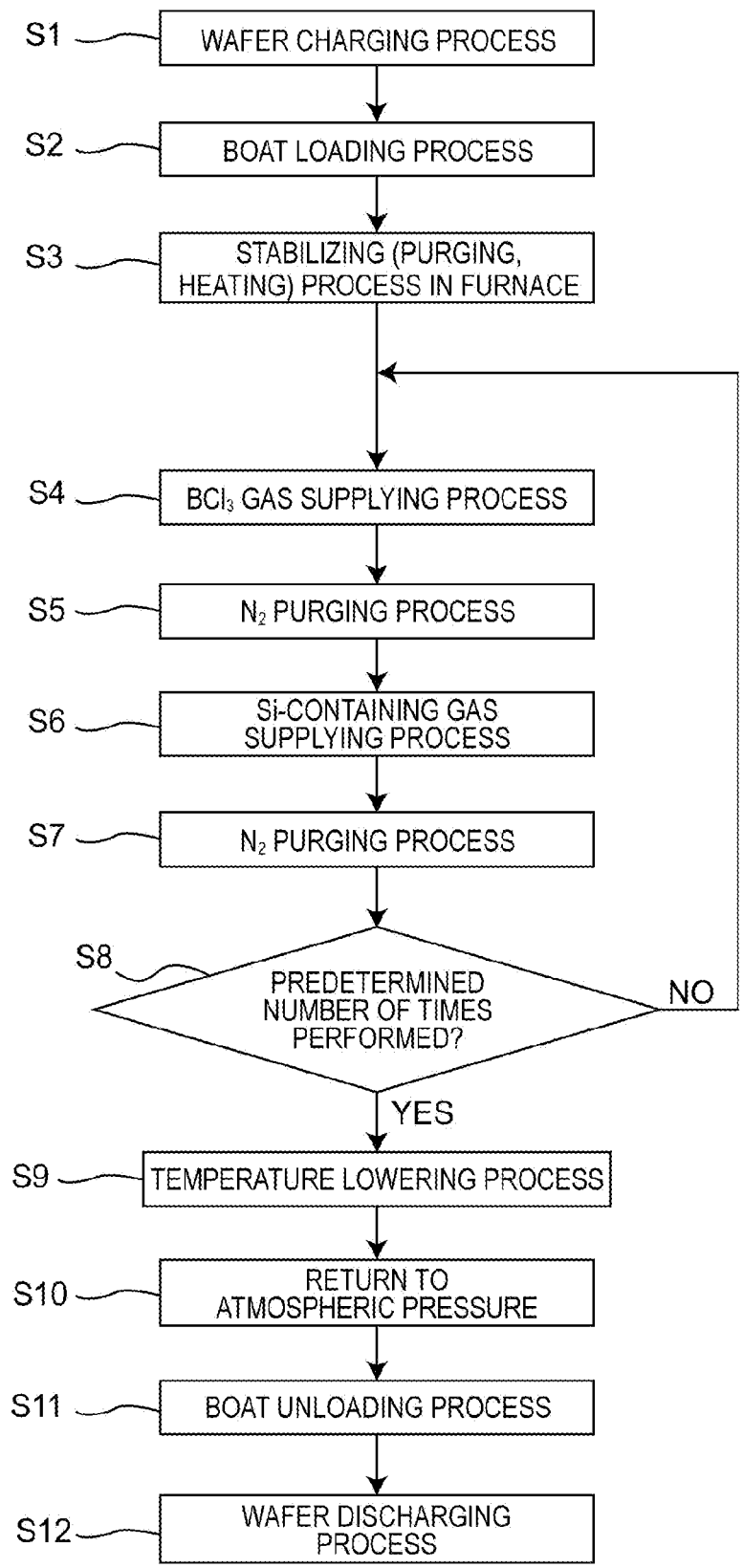
FIG. 5 is a diagram showing a gas supplying timing in the substrate processing process according to the embodiment of the present invention.
Figure 6:
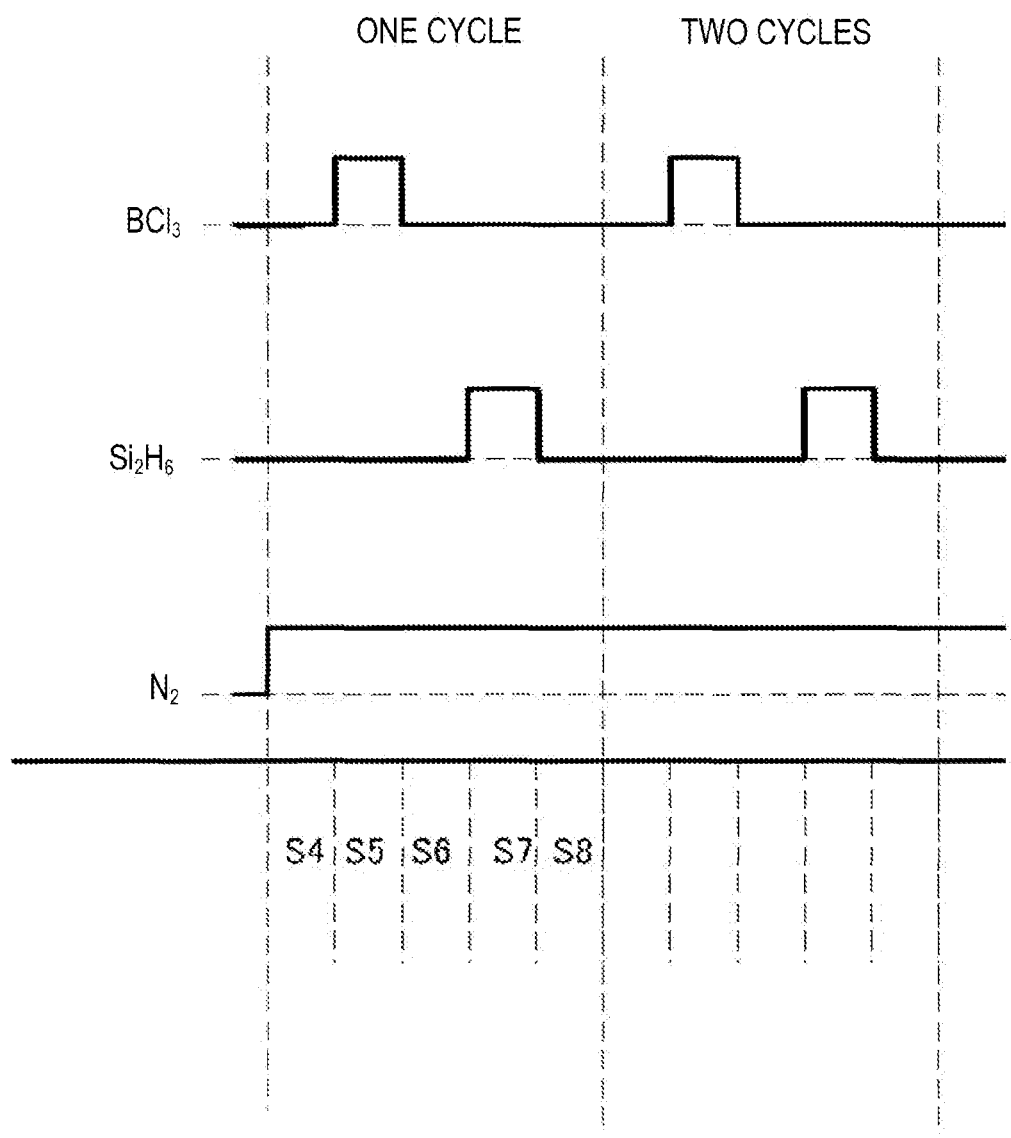
FIG. 6 is a schematic diagram showing a reaction image of a substrate in the substrate processing process according to the embodiment of the present invention.

Next, as one process of a semiconductor device manufacturing method, a substrate processing process that forms an Si film on the wafer 200 using the processing furnace 202 having the above-described configuration will be described. FIG. 4 is a flow diagram showing a film forming procedure in the substrate processing process according to the embodiment of the present invention; FIG. 5 is a flowchart showing a gas supplying timing in the substrate processing process according to the embodiment of the present invention; and FIG. 6 is a schematic diagram showing a reaction image of a substrate in the substrate processing process according to the embodiment of the present invention. Also, in the following description, the operations of the components included in the substrate processing apparatus are controlled by the controller 240.

(Loading Process)

First, a plurality of wafers 200 are charged in the boat 217 (step S1). Next, the boat elevator 115 is driven based on the control of the controller 240, and the boat 217 is ascended. Therefore, as shown in FIG. 2, the boat 217 holding the plurality of wafers 200 is loaded into the processing chamber 201 (boat loading) (step S2). At this time, a lower end of the outer tube 205 is closed by the seal cap 219 via the O-ring. Therefore, the processing chamber 201 is airtightly sealed.

It is preferable that $N_2$ gas, as a purge gas, flows in the processing chamber 201 until the loading of the boat 217 into the processing chamber 201 is completed. Specifically, it is preferable that a flow rate of the $N_2$ gas is adjusted by the mass flow controller while the valve is opened, and $N_2$ gas is supplied into the processing chamber 201 from the gas supply nozzles 301 and 302. Therefore, particles can be prevented from entering into the processing chamber 201 during the loading of the boat 217.

(Pressure Adjusting Process and Temperature Rising Process)

When the loading of the boat 217 into the processing chamber 201 is completed, an atmosphere in the processing chamber 201 is exhausted such that a pressure within the processing chamber 201 becomes a predetermined pressure (step S3). Specifically, the degree of opening of the APC valve 242 is feedback-controlled based on the pressure information detected by the pressure sensor while exhausting the atmosphere by the exhaust device 246, and thereby the pressure within the processing chamber 201 is to be a predetermined pressure.

In addition, the processing chamber 201 is heated by the heater 206 such that the temperature therein becomes a predetermined temperature (film forming temperature) (step S3). Specifically, the processing chamber 201 is heated so as to be at the film forming temperature (for example, 380° C.) therein, by controlling an electrical connection to the heater 206 based on temperature information detected by the temperature sensor.

Then, the rotation mechanism 254 is driven, and the wafer 200 loaded in the processing chamber 201 is rotated. Moreover, the wafer 200 is continuously rotated until a repeating process (step S8), in which the steps S4, S5, S6 and S7 are set as one cycle, and this cycle is performed a predetermined number of times, is completed.

(Boron-Containing Film Forming Process)

Subsequently, a process (step S4) of supplying $BCl_3$ gas, as a B-containing gas into the processing chamber 201, and the surface of the substrate is terminated-B (boron) by depositing B atoms on the wafer 200 is performed.

Specifically, valves connected to the $BCl_3$ gas supply source and the $N_2$ gas supply source are opened, and the degree of opening of the valves is adjusted by the mass flow controller such that the flow rate of $BCl_3$ gas of 5% concentration is within a range, for example, of 5 to 30 sccm, and preferably, 20 sccm, and while the valves are opened, a trace amount (5 to 30 sccm), which is not to be a doping material, of $BCl_3$ gas flowing in a $BCl_3$ gas supply pipe is supplied into the processing chamber 201 from the gas supply nozzles 302, and thereby B (boron) is deposited on the substrate to boron-terminate the surface of the substrate.

$BCl_3$ gas, not deposited on the wafer, flows through the processing chamber 201, and then is exhausted from the gas exhaust pipe 231. As described above, the temperature of the heater 206 is maintained at a temperature in a range, for example, of 300 to 400° C. (380° C. preferably), and the pressure in the processing chamber 201 is maintained in a range of 30 to 300 pa, and preferably, at a pressure of 120 Pa.

Moreover, in the $BCl_3$ gas supplying process (step S4), $N_2$ gas may be introduced into the processing chamber 201 from the gas supply nozzle 301 or 302, or the gas supply nozzles 301 and 302 so as to promote the diffusion of $BCl_3$ gas in the processing chamber 201.

When a predetermined time (for example 10 to 300 seconds, and preferably 60 seconds) has passed, the supply of $BCl_3$ gas is stopped.

In addition, the inside of the processing chamber 201 is vacuum-exhausted by the exhaust device 246 by largely opening the APC valve 242 or increasing the degree of opening thereof, and then excess $BCl_3$ gas, $Cl_2$ gas, $N_2$ gas, a reaction product, or the like, which remain without being deposited on the wafer 200 is exhausted from the inside of the processing chamber 201 by vacuum-exhausting or purging with $N_2$ gas.

At this time, $N_2$ is supplied into the processing chamber 201 as the purge gas from the gas supply nozzle 301 or 302, or the gas supply nozzles 301 and 302 (step S5).

[Silicon-Containing Gas Supplying Process]

Subsequently, a process (step S6), in which an $Si_2H_6$ gas, as the Si-containing gas, is supplied into the processing chamber 201 by increasing the pressure in the processing chamber 201 (for example, 120 pa), and an Si film is formed on the wafer 200 by reaction with the B (boron) atoms deposited on the wafer 200, is performed.

Specifically, valves connected to the $Si_2H_6$ gas supply source and the $N_2$ gas supply source are opened, and the flow rate of the $Si_2H_6$ gas is adjusted by the mass flow controller, for example, within 50 sccm, and while the valves are opened, the $Si_2H_6$ gas flowing in an $Si_2H_6$ gas supply pipe is supplied into the processing chamber 201 from the gas supply nozzles 302.

In parallel with the supply of $Si_2H_6$ gas, $N_2$ gas is supplied into the processing chamber 201. Specifically, a valve connected to the $N_2$ gas supply source is opened, and the flow rate thereof is adjusted by the mass flow controller, for example, within 50 sccm, and while the valve is opened, the $N_2$ gas flowing in an $N_2$ gas supply pipe is supplied into the processing chamber 201 from the gas supply hole of the gas supply nozzles 302.

When a predetermined time (for example, 900 seconds) has passed, the supply of $Si_2H_6$ gas is stopped. In addition, the inside of the processing chamber 201 is vacuum-exhausted by the exhaust device 246 by largely opening the APC valve 242 or increasing the degree of opening thereof, and then the remaining $Si_2H_6$ gas, $N_2$ gas, a reaction product, or the like are exhausted from the inside of the processing chamber 201 by supplying the $N_2$ gas to purge with $N_2$ gas therein (step S7).

Moreover, in the Si-containing gas supplying process (step S6), the flow rate is adjusted by the mass flow controller while the valve is opened, and the N2 gas may be introduced into the processing chamber 201 from the gas supply holes of the gas supply nozzles 301 and 302 which are used, so as to promote the diffusion of the Si-containing gas in the processing chamber 201, and in the B-containing gas supplying process (step S4) and the Si-containing gas supplying process (step S6), the $N_2$ gas may be introduced into the processing chamber 201 through the gas supply holes of the gas supply nozzles 301 and 302 which is not used, so as to prevent the B-containing gas or Si-containing gas from entering into the gas supply nozzles 301 and 302. That is, by introducing $N_2$ gas from the gas supply hole of the Si-containing gas supply nozzle in the B-containing gas supplying process (step S4), and from the gas supply hole of the B-containing gas supply nozzle in the Si-containing gas supplying process (step S6), it is also possible to prevent the B-containing gas or Si-containing gas from entering into the gas supply nozzles 301 and 302.

(Repeating Process)

Then, the above-described B-containing gas supplying process (step S4), the purging process (step S5), the Si-containing gas supplying process (step S6), and the purging process (step S7) are set as one cycle, and this cycle is performed a predetermined number of times (one or more times) (step S8).

(Temperature Lowering Process)

After a Si film having a predetermined film thickness is formed, a temperature lowering process (step S9) is proceeded. Specifically, the inside of the processing chamber 201 becomes filled with $N_2$ gas by largely opening the valve connected to the $N_2$ gas supply source or increasing the degree of opening thereof.

(Atmosphere Returning Process and Temperature Lowering Process)

When the temperature lowering process is stopped (step S9) by passing a predetermined time (for example, 120 seconds), the rotation of the wafer 200 is stopped by stopping the rotation of the boat 217. In addition, the pressure inside of the processing chamber 201 is returned to atmospheric pressure while the temperature of the wafer 200 is lowered. Specifically, with the valve open, $N_2$ gas is supplied into the processing chamber 201 while the degree of opening of the valve of the exhaust device 246 is feedback-controlled based on the pressure information detected by the pressure sensor while exhausting the atmosphere by the exhaust device 246, and thereby the pressure within the processing chamber 201 is increased to that of atmospheric pressure (step S10). Then, the temperature of the wafer 200 is lowered by controlling the amount of electricity supplied to the heater 206.

(Boat Unloading Process)

Thereafter, the boat 217 holding the processed wafer 200 is unloaded (boat unloading) from the inside of the processing chamber 201 in the reverse procedure of the above-described loading process (step S11). Then, the processed wafer 200 is discharged (wafer discharging) from the boat 217 (step S12). Subsequently, the substrate processing process according to the embodiment of the present invention is ended.

As described above, by performing the purging process after supplying the B-containing gas and the Si-containing gas, it is inhibited the B-containing gas and the Si-containing gas being present in a gas phase at the same time, and therefore, to inhibit a dopant effect of the B-containing gas (or a boron atom) caused by the B-containing gas and the Si-containing gas being present in the gas phase, and form an Si film having film characteristics very similar to the non-doped Si film, that is, an Si film having a B (boron) concentration of $3.0 \times 10^{20}$ atom/cm$^3$ or less.

Moreover, in the present invention, the above formed Si film having film characteristics very similar to a non-doped Si film, that is, a Si film having a B (boron) concentration of $3.0 \times 10^{20}$ atom/cm$^3$ or less is also described as a non-doped Si film similar to a non-doped Si film.

Further, it is possible to form a boron-containing film having a low concentration on the surface of the substrate by reducing the flow rate of the supplied B-containing gas, obtain an effect of promoting an Si-containing gas decomposition of boron on the surface of the substrate (on a surface of the formed film), and form an non-doped Si film having a very small boron concentration content.

(Comparison Description of Film Thickness Uniformity Between the Present Invention and the Related Art)

FIG. 7A is a diagram showing film thickness uniformity of an Si film of the related art, and FIG. 7B is a diagram showing film thickness uniformity of an Si film according to the present invention. Herein, when 125 wafer sheets are processed, a wafer at the top of the boat is set to be TOP, a wafer at the center of the boat as CENTER, the 100th wafer from the top as BOTTOM 100, and the 125th wafer from the top as BOTTOM 125, respectively, and an average thickness of respective wafers, in-plane film thickness uniformity of wafers, and film thickness uniformity between respective wafers thereof are shown.

The in-plane film thickness uniformity of substrates according to the related art is 3.0%, 2.2%, 1.5%, and 2.2% for TOP, CENTER, BOTTOM 100, and BOTTOM 125, respectively, while that of the present invention is 0.6%, 0.7%, 0.9%, and 1.1% thereof, respectively. Accordingly, it can be seen that a significant improvement in the in-plane uniformity is observed from the present invention. The film thickness uniformity between substrates of the related art is 69.38 Å±37.19% and considerable variation is seen, but in the present invention, it is 150.92 Å±0.52%. Therefore, it can be confirmed that the present invention has an excellent in-plane film thickness uniformity of wafers and film thickness uniformity between wafers.

Figure 8:
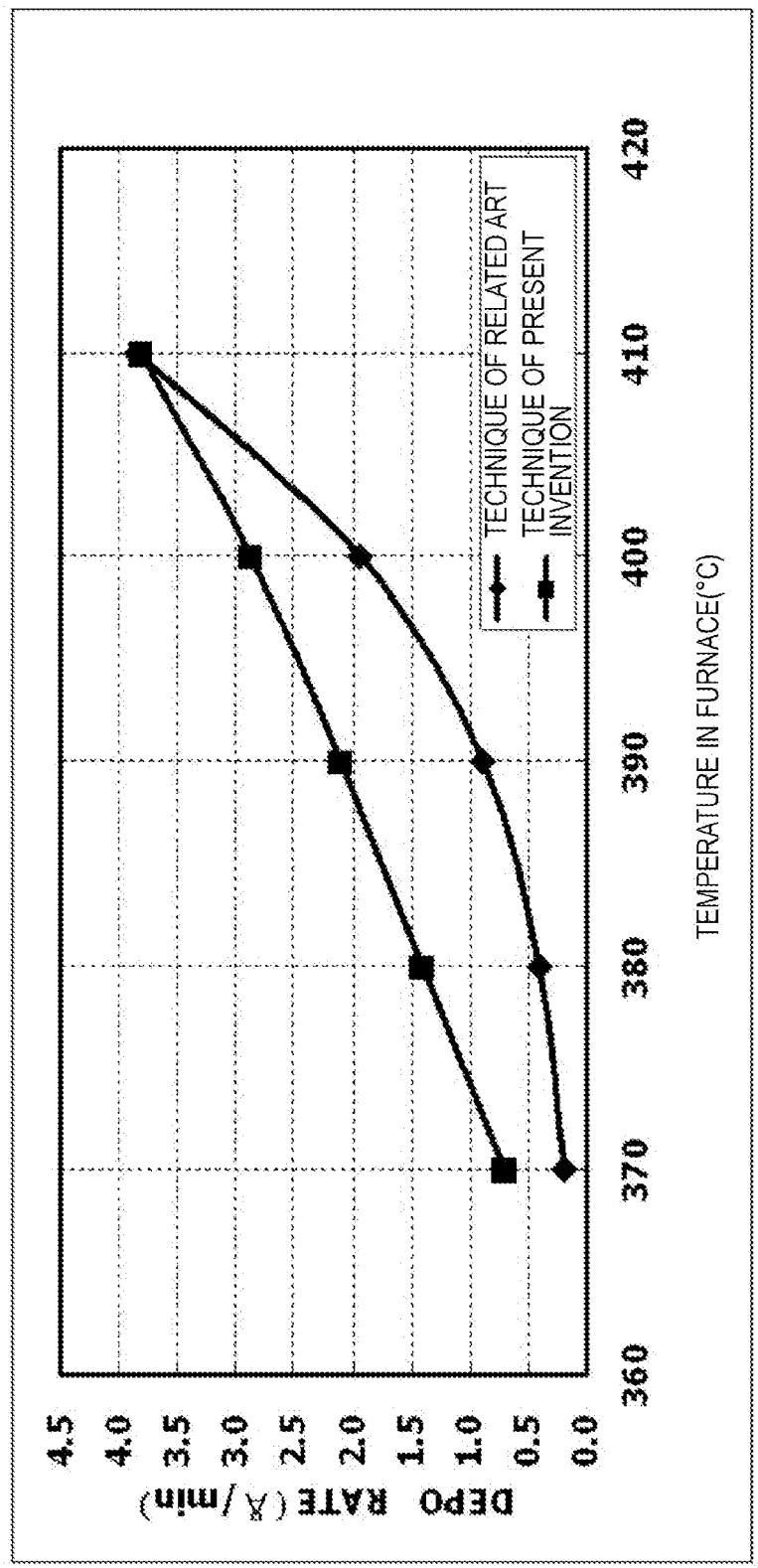
FIG. 8 is a diagram showing a relationship between a temperature in the furnace and a deposition rate of the present invention and the related art.

FIG. 8 is a diagram showing a relationship between a temperature in the furnace and a deposition rate of the present invention and the related art. In the temperature range of 400° C. or less, since the deposition rate is very slow in the related art, it is not practical. However, according to the present invention, even at 380° C., the deposition rate shows a practical value of 1.4 Å/min. Therefore, according to the present invention, it is possible to form an Si film at a lower temperature than the related art, and thereby it is clear that the present invention provides a practical method for film formation.

Figure 9:
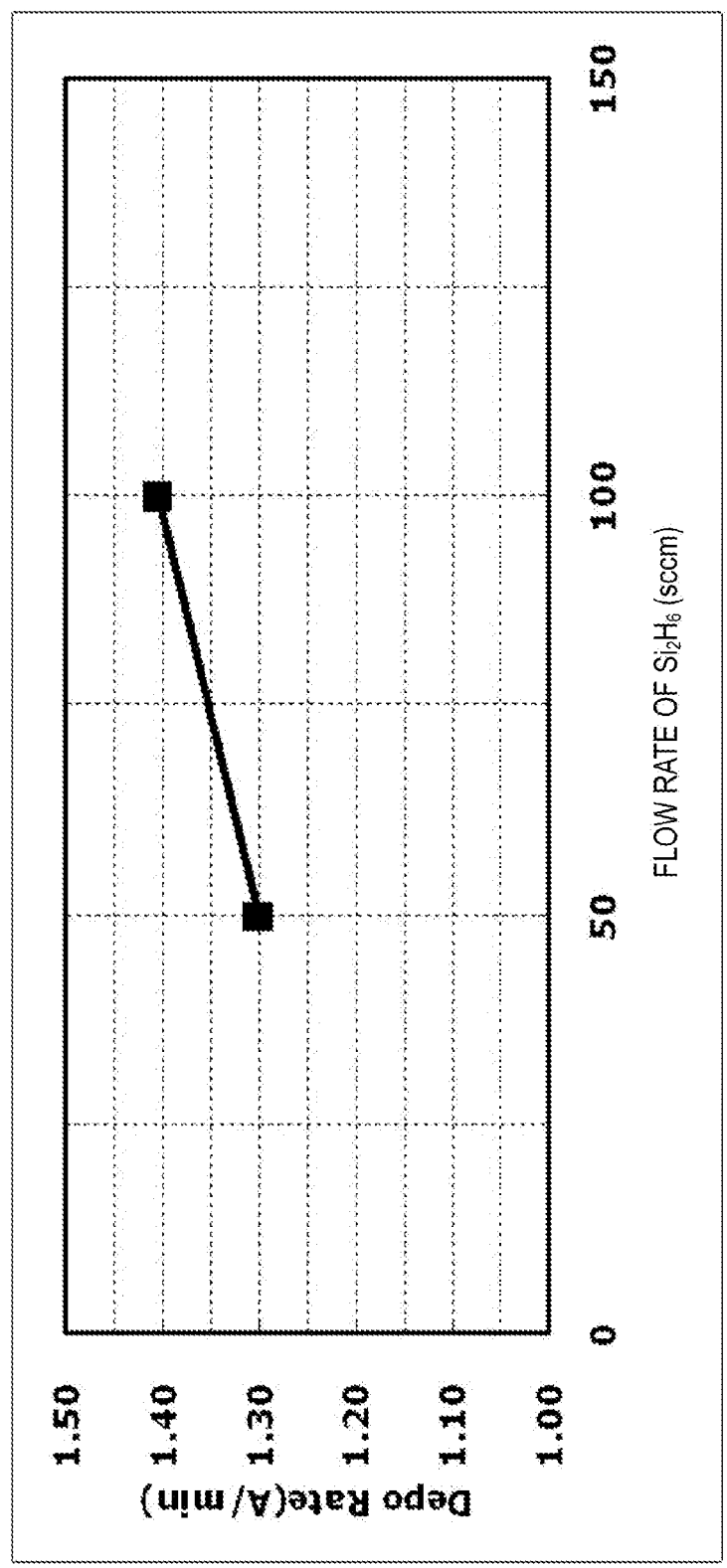
FIG. 9 is a diagram showing a relationship between a flow rate of $Si_2H_6$ gas and the deposition rate according to the present invention.
Figure 10:
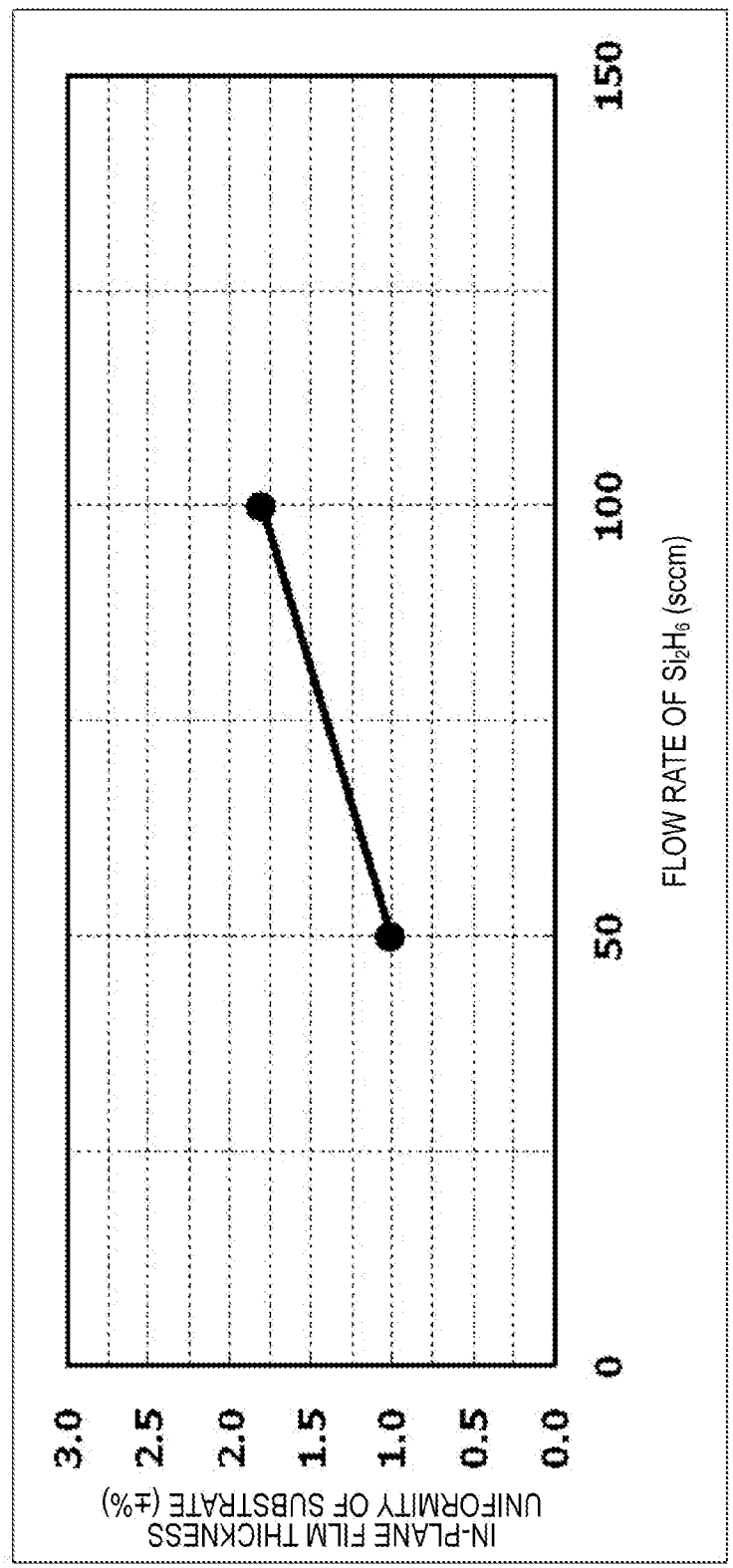
FIG. 10 is a diagram showing a relationship between the flow rate of $Si_2H_6$ gas and an in-plane film thickness uniformity of a substrate according to the present invention.
Figure 11:
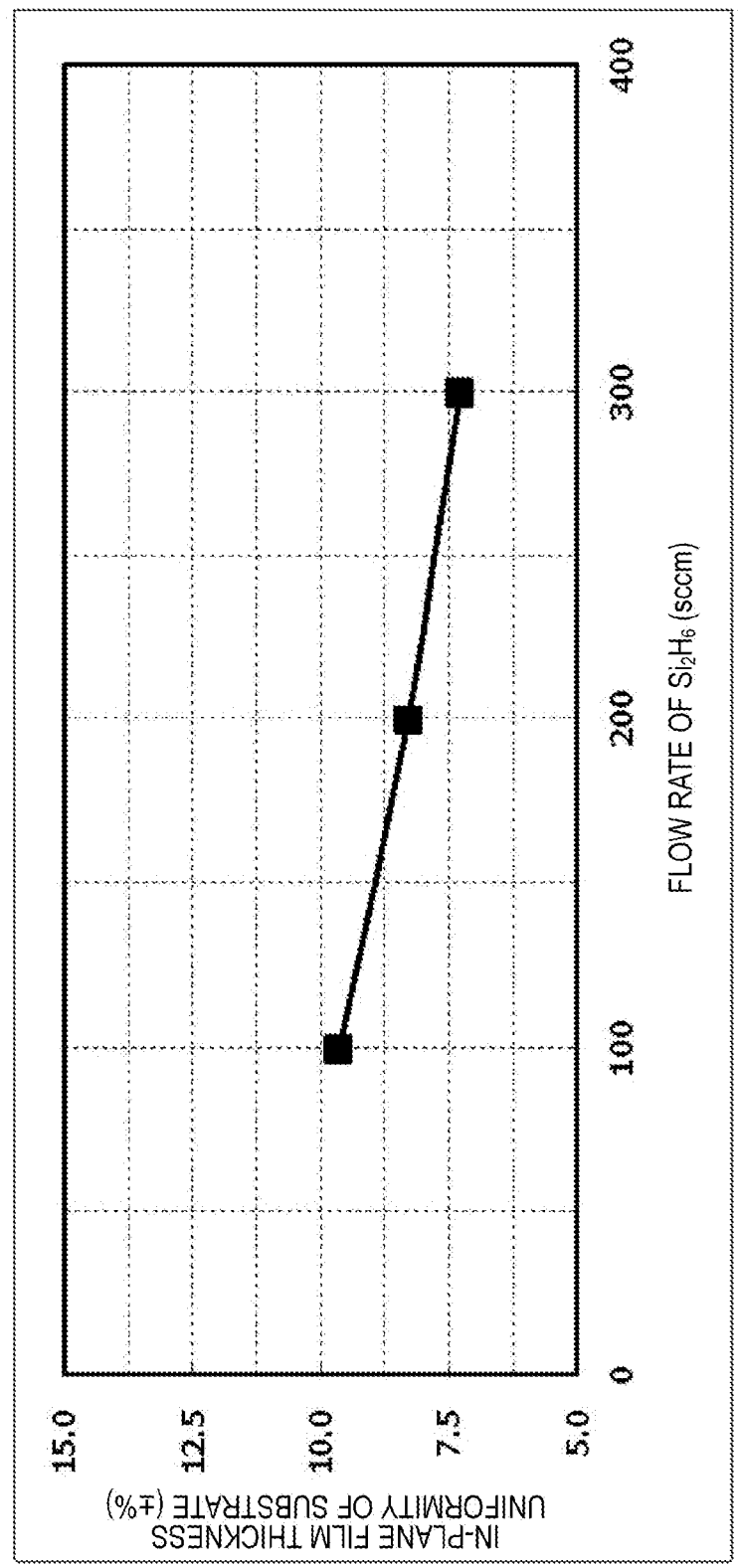
FIG. 11 is a diagram showing the relationship between the flow rate of Si2H6 gas and the in-plane film thickness uniformity of a substrate of the related art.

FIG. 9 is a diagram showing a relationship between a flow rate of $Si_2H_6$ gas and the deposition rate according to the present invention. FIG. 9 shows that even when the flow rate of the $Si_2H_6$ gas is halved from 100 sccm to 50 sccm, the deposition rate is slightly decreased, by only 0.1 Å/min, from 1.4 Å/min to 1.3 Å/min. In addition, FIG. 10 shows a relationship between a flow rate of $Si_2H_6$ and the in-plane film thickness uniformity of the substrate according to the present invention. From FIG. 10, it can be seen that if the flow rate of $Si_2H_6$ gas is halved from 100 sccm to 50 sccm, the in-plane film thickness uniformity of the substrate is improved from ±1.8% to ±1.0%. Meanwhile, FIG. 11 shows the relationship between the flow rate of $Si_2H_6$ gas and the in-plane film thickness uniformity of a substrate of the related art. In the related art, since it is necessary to significantly increase the flow rate of $Si_2H_6$ gas in order to improve the in-plane film thickness uniformity of the substrate, it is clear that the consumption of $Si_2H_6$ gas may be greatly reduced according to the present invention.

Effects of the Present Invention

According to the present invention, one or more effects will be achieved as described below.

(a) It is possible to form a non-doped Si film at a low temperature, and cope with lowering of the temperature required for the miniaturization of devices.

(b) Since the purging is performed after supplying the B-containing gas and the Si-containing gas, a state in which the B-containing gas and Si-containing gas are present in the gas phase at the same time is avoided, and thereby it is possible to inhibit the effect of B atoms, as a dopant, and to promote the effect of Si-based gas, as a decomposition gas (catalyst), and reduce the usage of B-containing gas.

(c) It is possible to significantly reduce the consumption of Si-containing gas compared with the related art, and reduce the device manufacturing costs.

(d) It is possible to prevent a B (boron) concentration in the formed Si film from being greater than $3.0 \times 10^{20}$ atom/cm$^3$, above which the etching rate is significantly reduced, and thereby form a non-doped Si film having a B (boron) concentration of $3.0 \times 10^{20}$ atom/cm$^3$ or less.

(e) Since the film may be formed by a batch type vertical CVD apparatus without using a special mechanism, it is possible to reduce manufacturing costs and improve productivity.

As described above, although a case of using the vertical type substrate processing apparatus has been described in the above embodiment, it may be similarly applied to a single wafer type substrate processing apparatus.

In addition, it is obvious that the present invention is not limited to the above described embodiment, and various modifications may be possible without departing from the scope of the present invention.

For example, although a case of using the cassette as a wafer carrier for transferring the substrate has been described in the above embodiment, a FOUP may be used. When using the FOUP, a FOUP opener for removing a lid of the FOUP may be provided in the device.

In addition, in the above embodiment, although a case of setting the supply flow rate of B-containing gas to 5 to 30 sccm and the supply flow rate of Si-containing gas to 50 sccm has been described, it is preferable to control such that a supply flow ratio of the B-containing gas to Si-containing gas is 1:50.

In addition, although a case of using $BCl_3$ as the B-containing gas has been described in the above embodiment, it is not limited thereto, but it is preferable to use B-containing gas with a low reactivity.

Further, in the above embodiment, although a case of performing the pressure adjusting process and temperature raising processes after loading the substrate has been described, it is not limited thereto, but it is preferable to perform a seeding on the substrate by using the $Si_2H_6$ gas at a film forming temperature or a temperature lower than that thereof. When the seeding is performed on the substrate, it is possible to inhibit film defects during processing of the substrate.

The present invention may be applied to a case of performing the film forming process to form various films such as an oxide film, nitride film, metal film, or the like by using a chemical vapor deposition (CVD) method, atomic layer deposition (ALD) method, physical vapor deposition (PVD) method, or the like, and also, it may be applied to a case of performing other substrate processing such as plasma processing, diffusion processing, annealing, oxidation, nitridation, lithography or the like. In addition, the present invention may be applied to other substrate processing apparatuses such as an etching apparatus, an annealing apparatus, an oxidation processing apparatus, a nitridation processing apparatus, an exposing apparatus, a coating apparatus, a molding apparatus, a developing apparatus, a dicing apparatus, a wire bonding apparatus, a drying apparatus, a heating apparatus, an inspection device or the like, in addition to the thin film formation apparatus. Further, the present invention is not limited to the vertical substrate processing apparatus 100, and may be applied to a horizontal substrate processing apparatus or various single wafer type substrate processing apparatuses.

Further, the present invention is not limited to the semiconductor manufacturing device, or the like, for processing a semiconductor wafer, such as the substrate processing apparatus 100 according to the present invention, and may be also applied to a substrate processing apparatus for processing a glass substrate such as a liquid crystal display (LCD) manufacturing apparatus, solar cell manufacturing apparatus or the like.

Preferable Aspects of Invention

In the following, preferable aspects of the present invention will be additionally stated.

(Supplementary Note 1)

According to one aspect of the present invention, there is provided a method of manufacturing a semiconductor device, including: a process of transferring a substrate into a processing chamber; a first gas supplying process of boron-terminating on the surface of the substrate by supplying boron-containing gas in an inside of the processing chamber;

a first purging process of purging the inside of the processing chamber under an atmosphere of the boron-containing gas supplied in the first gas supplying process; a second gas supplying process of supplying a silicon-containing gas into the processing chamber to form a non-doped Si film on the substrate, after the first purging process; and a second purging process of purging the inside of the processing chamber under an atmosphere of the silicon-containing gas.

(Supplementary Note 2)

According to another aspect of the present invention, there is provided a method of processing a substrate, including: a process of transferring a substrate into a processing chamber; a first gas supplying process of supplying a boron-containing gas into the processing chamber; a first purging process of purging an inside of the processing chamber under an atmosphere of the boron-containing gas supplied in the first gas supplying process; a second gas supplying process of supplying a silicon-containing gas into the processing chamber to form a non-doped Si film on the substrate, after the first purging process; and a second purging process of purging the inside of the processing chamber under an atmosphere of the silicon-containing gas.

(Supplementary Note 3)

According to another aspect of the present invention, there is provided a substrate processing apparatus, including: a processing chamber configured to process a substrate; a boron-containing gas supply system installed in the processing chamber to supply a boron-containing gas therein; a silicon-containing gas supply system installed in the processing chamber to supply a silicon-containing gas therein; a controller configured to control the boron-containing gas supply system and the silicon-containing gas supply system so as to control supplying amounts of the boron-containing gas and the silicon-containing gas; wherein the controller controls the boron-containing gas supply system and the silicon-containing gas supply system, when the substrate is transferred into the processing chamber, boron atoms supply the boron-containing gas from the boron-containing gas supply system to boron-terminate on the surface of the substrate, and after supplying the boron-containing gas, the silicon-containing gas is supplied so as to form a non-doped Si film on the substrate.

(Supplementary Note 4)

In addition, there are provided a method of manufacturing a semiconductor device and a substrate processing method, including a process of repeating the first gas supplying process, the first purging process, the second gas supplying process, and the second purging process a predetermined number of times.

(Supplementary Note 5)

In addition, there are provided a method of manufacturing a semiconductor device, a substrate processing method, and the substrate processing apparatus, in which the first gas supplying process boron-terminates on the surface of the substrate by supplying the boron-containing gas.

(Supplementary Note 6)

In addition, there are provided a method of manufacturing a semiconductor device, a substrate processing method, and the substrate processing apparatus, in which the non-doped Si film has a boron concentration of $3.0 \times 10^{20}$ atom/cm$^3$ or less.

(Supplementary Note 7)

In addition, there are provided a method of manufacturing a semiconductor device, a substrate processing method, and the substrate processing apparatus, in which the boron-containing gas is $BCl_3$.

(Supplementary Note 8)

In addition, there are provided a method of manufacturing a semiconductor device and a substrate processing method, in which a supply flow rate of the boron-containing gas supplied in the first gas supplying process is 5 to 30 sccm.

FIG. 5

S1: WAFER CHARGING PROCESS
S2: BOAT LOADING PROCESS
S3: STABILIZING (PURGING, HEATING) PROCESS IN FURNACE
S4: BCl$_3$ GAS SUPPLYING PROCESS
S5: N$_2$ PURGING PROCESS
S6: Si-CONTAINING GAS SUPPLYING PROCESS
S7: N$_2$ PURGING PROCESS
S8: PREDETERMINED NUMBER OF TIMES PERFORMED?
S9: TEMPERATURE LOWERING PROCESS
S10: RETURN TO ATMOSPHERIC PRESSURE
S11: BOAT UNLOADING PROCESS
S12: WAFER DISCHARGING PROCESS

FIG. 6

ONE CYCLE
TWO CYCLES

FIG. 7A

AVERAGE FILM THICKNESS
IN-PLANE FILM THICKNESS UNIFORMITY OF SUBSTRATE (±%)
FILM THICKNESS UNIFORMITY BETWEEN SUBSTRATES (AVERAGE FILM THICKNESS ±%)

FIG. 7B

AVERAGE FILM THICKNESS
IN-PLANE FILM THICKNESS UNIFORMITY OF SUBSTRATE (±%)
FILM THICKNESS UNIFORMITY BETWEEN SUBSTRATES (AVERAGE FILM THICKNESS ±%)

FIG. 8

TECHNIQUE OF RELATED ART
TECHNIQUE OF PRESENT INVENTION
TEMPERATURE IN FURNACE

FIG. 9

FLOW RATE OF $Si_2H_6$ (sccm)

FIG. 10

IN-PLANE FILM THICKNESS UNIFORMITY OF SUBSTRATE
FLOW RATE OF $Si_2H_6$ (sccm)

FIG. 11

IN-PLANE FILM THICKNESS UNIFORMITY OF SUBSTRATE
FLOW RATE OF $Si_2H_6$ (sccm)

What is claimed is:

1. A method of manufacturing a semiconductor device, comprising:
   a process of transferring a substrate into a processing chamber;
   a first gas supplying process of supplying a boron-containing gas into the processing chamber to boron-terminate on the surface of the substrate;
   a first purging process of purging an inside of the processing chamber under an atmosphere of the boron-containing gas supplied in the first gas supplying process;
   a second gas supplying process of supplying a silicon-containing gas into the processing chamber to form a boron-inhibited Si film having a boron concentration of $3.0\times10^{20}$ atom/cm$^3$ or less on the substrate, after the first purging process; and
   a second purging process of purging the inside of the processing chamber under an atmosphere of the silicon-containing gas.

2. The method according to claim 1, wherein a supply flow rate of the boron-containing gas supplied into the processing chamber in the first gas supplying process is 5 to 30 sccm.

3. The method according to claim 2, wherein a supply time of the boron-containing gas supplied into the processing chamber in the first gas supplying process is 10 to 300 seconds.

4. The method according to claim 2, wherein the boron-containing gas is BCl3.

5. The method according to claim 1, wherein the substrate is processed at a temperature lower than 400° C.

6. The method according to claim 5, wherein a pressure in the processing chamber is maintained in a range of 30 to 300 Pa.

7. The method according to claim 1, wherein a pressure in the processing chamber is maintained in a range of 30 to 300 Pa.

8. A method of processing a substrate, comprising:
   a process of transferring a substrate into a processing chamber;
   a first gas supplying process of supplying a boron-containing gas into the processing chamber to boron-terminate on the surface of the substrate;
   a first purging process of purging an inside of the processing chamber under an atmosphere of the boron-containing gas supplied in the first gas supplying process;
   a second gas supplying process of supplying a silicon-containing gas into the processing chamber to form a boron-inhibited Si film having a boron concentration of $3.0\times10^{20}$ atom/cm$^3$ or less on the substrate, after the first purging process; and
   a second purging process of purging the inside of the processing chamber under an atmosphere of the silicon-containing gas.

* * * * *